(12) United States Patent
Lu

(10) Patent No.: US 11,256,265 B2
(45) Date of Patent: Feb. 22, 2022

(54) GROUND DETECTION DEVICE, ROBOT AND GROUND DETECTION METHOD

(71) Applicant: SHENZHEN SILVER STAR INTELLIGENT TECHNOLOGY CO., LTD, Guangdong (CN)

(72) Inventor: Weike Lu, Guangdong (CN)

(73) Assignee: SHENZHEN SILVER STAR INTELLIGENT TECHNOLOGY CO., LTD, Guangdong (CN)

( * ) Notice: Subject to any disclaimer, the term of this patent is extended or adjusted under 35 U.S.C. 154(b) by 364 days.

(21) Appl. No.: 16/375,245

(22) Filed: Apr. 4, 2019

(65) Prior Publication Data

US 2020/0150678 A1  May 14, 2020

(30) Foreign Application Priority Data

Nov. 9, 2018 (CN) .......................... 201811329981.9

(51) Int. Cl.
  *H03F 3/08* (2006.01)
  *G05D 1/02* (2020.01)
  *G05D 1/00* (2006.01)
  *H03F 3/45* (2006.01)
(52) U.S. Cl.
  CPC ......... *G05D 1/0231* (2013.01); *G05D 1/0088* (2013.01); *G05D 2201/0217* (2013.01);
  (Continued)
(58) Field of Classification Search
  CPC .......... H03F 3/45475; H03F 2200/129; H03F 2200/165; H03F 2203/45116;
  (Continued)

(56) References Cited

U.S. PATENT DOCUMENTS 6,348,682 B1 * 2/2002 Lee ........................ H04B 10/69
                                                  250/214 A

FOREIGN PATENT DOCUMENTS

CN   101311746   11/2008
CN   101339249   1/2009
(Continued)

OTHER PUBLICATIONS

Ding Yi-Peng' Fang Guang-You; High-resolution through-the-wall radar imaging algorithm based on ARMA model. Computer Engineering and Applications' 2009' 45(35); 135-138.
(Continued)

*Primary Examiner* — Khanh V Nguyen
*Assistant Examiner* — Khiem D Nguyen
(74) *Attorney, Agent, or Firm* — Rankin, Hill & Clark LLP

(57) ABSTRACT

Embodiments of the present application relate to the field of ground detection, and disclose a ground detection device, a robot and a ground detection method. The ground detection device includes a control circuit, a signal trigger circuit, a signal sampling circuit and an amplification circuit. Where, the signal sampling circuit is configured to acquire reflected light of the optical signal reflected by a detection area and ambient interference light, and to generate a second voltage signal according to the reflected light and the ambient interference light; the amplification circuit is configured to amplify the second voltage signal to acquire a third voltage signal; and the control circuit is configured to compare the third voltage signal with a preset voltage, and to determine whether there is a ground within the detection area according to a comparison result.

12 Claims, 3 Drawing Sheets

(52) U.S. Cl.
CPC .... *H03F 3/45475* (2013.01); *H03F 2200/129* (2013.01); *H03F 2200/165* (2013.01); *H03F 2203/45116* (2013.01); *H03F 2203/45528* (2013.01)

(58) Field of Classification Search
CPC ........ H03F 2203/45528; G05D 1/0231; G05D 1/0088; G05D 2201/0217; G05D 2201/02; G01S 17/931
USPC ................ 330/250, 282, 290, 291, 260, 259
See application file for complete search history.

(56) References Cited

FOREIGN PATENT DOCUMENTS

| | | |
|---|---|---|
| CN | 101596115 | 12/2009 |
| CN | 101846744 | 9/2010 |
| CN | 102135619 | 7/2011 |
| CN | 104020460 | 9/2014 |
| CN | 105044661 | 11/2015 |
| CN | 106793906 | 5/2017 |
| CN | 106950983 | 7/2017 |
| CN | 206365856 | 8/2017 |
| CN | 107608360 | 1/2018 |
| CN | 108261787 | 7/2018 |
| CN | 108553027 | 9/2018 |
| CN | 108598858 | 9/2018 |
| WO | 2008/140253 | 11/2008 |

OTHER PUBLICATIONS

Fang, Daqian; Fang, Li; Technique and reconstruction examples of electricity saving in the countryside; May 1, 2014; 428-430; Jindun Publishing Company; China.

\* cited by examiner waveform of the first voltage signal | waveform of the third voltage signal waveform of the first voltage signal | waveform of the third voltage signal ns of the present application relate to the field of ground detection, and in particular to a ground detection device, a robot and a ground detection method.

GROUND DETECTION DEVICE, ROBOT AND GROUND DETECTION METHOD

TECHNICAL FIELD

Embodiments of the present application relate to the field of ground detection, and in particular to a ground detection device, a robot and a ground detection method.

BACKGROUND

With the development of technologies, the robot is increasingly used in people's lives. In order to avoid damage caused by that the robot falls forward when there is no ground in the direction of moving forward, it is often necessary to arrange a ground detection device in the robot, so as to detect ground conditions on which the robot is located.

The inventor has found that at least the following problem exist in the prior art: in a case of ground detection, when the reflectivity of the ground is relatively low, the amplitude of the signal generated by the collected light reflected by ground is relatively small, which generally cannot determine the true ground condition, thereby resulting in inaccurate ground detection. Therefore, the ground detection device in the prior art cannot meet the demand for ground detection accuracy.

SUMMARY

The purpose of embodiments of the present application is to provide a ground detection device, a robot and a ground detection method, which enables to detect for a detection area, and to acquire an accurate detection result.

In order to solve the above technical problem, the embodiments of the present application provide a ground detection device, which includes a control circuit, a signal trigger circuit, a signal sampling circuit and an amplification circuit;

where, a first end of the control circuit is connected to the signal trigger circuit, a second end of the control circuit is connected to an output end of the amplification circuit, and the signal sampling circuit is connected to an input end of the amplification circuit;

where, the control circuit is configured to transmit a first voltage signal to the signal trigger circuit; the signal trigger circuit is configured to acquire the first voltage signal, and to generate an optical signal according to the first voltage signal; the signal sampling circuit is configured to acquire reflected light of the optical signal reflected by a detection area and ambient interference light, and to generate a second voltage signal according to the reflected light and the ambient interference light; the amplification circuit is configured to amplify the second voltage signal to acquire a third voltage signal; and the control circuit is configured to compare the third voltage signal with a preset voltage, and to determine whether there is a ground within the detection area according to a comparison result.

The embodiments of the present application further provide a robot, which includes the above-mentioned ground detection device.

The embodiments of the present application further provide a ground detection method, which is applied to the above-mentioned robot, and includes the following steps of:

turning on the signal trigger circuit, and collecting first input data of an operational amplifier for the detection area; turning off the signal trigger circuit, and collecting second input data of the operational amplifier for the detection area; and determining whether there is a ground within the detection area according to the first input data of the operational amplifier and the second input data of the operational amplifier.

Compared with the prior art, in the embodiments of the present application, the control circuit controls the signal trigger circuit to generate the optical signal, and the signal sampling circuit acquires the reflected light of the optical signal reflected by the detection area and the ambient interference light, and generates the detection signal for the detection area. When the reflectivity of the ground is relatively low, the detection signal sufficient to determine the detection area may be acquired through the amplification effect of the amplification circuit, and the real ground conditions within the detection area may be acquired through comparing the detection signal with the preset voltage.

Additionally, the ground detection device further includes a circuit for filtering out interference. A first end of the circuit for filtering out interference is connected to the sampling circuit, and a second end of the circuit for filtering out interference is connected to the input end of the amplification circuit. Where, the circuit for filtering out interference is configured to filter out a DC voltage signal generated in the second voltage signal due to the ambient interference light. In this implementation, through adding the circuit for filtering out interference, the DC signal generated in the second voltage signal due to the ambient interference light can be filtered out, thereby eliminating the influence of the ambient interference light, and making the ground detection result for the detection area more accurate.

Additionally, the signal trigger circuit includes a strobe element, a transmitting tube and a first resistor. The first end of the control circuit is connected to an input end of the strobe element, a first output end of the strobe element is connected to a first end of the transmitting tube, and a second output end of the strobe element is grounded. Where, a second end of the transmitting tube is connected to a first end of the first resistor, and a second end of the first resistor is connected to a power source. Where, the control circuit controls the strobe element to be in an on state if it is determined that the voltage acquired by the signal trigger circuit is not less than the first voltage signal.

Additionally, the signal sampling circuit includes a receiving tube and a second resistor. A first end of the receiving tube is connected to a first end of the second resistor and the first end of the circuit for filtering out interference, a second end of the receiving tube is grounded, and a second end of the second resistor is connected to a power source.

Additionally, the amplification circuit includes a third resistor, a fourth resistor, a fifth resistor, a sixth resistor, a seventh resistor and an amplifier. Where, a first end of the third resistor is connected to the second end of the circuit for filtering out interference, and a second end of the third resistor is connected to a negative input end of the amplifier; a first end of the fourth resistor is grounded, and a second end of the fourth resistor is connected to a positive input end of the amplifier; a first end of the fifth resistor is connected to the second end of the fourth resistor, and a second end of the fifth resistor is connected to a power source; the sixth resistor is connected in parallel between the negative input end of the amplifier and an output end of the amplifier; and a first end of the seventh resistor is connected to the output end of the amplifier, and a second end of the seventh resistor is the output end of the amplification circuit.

Additionally, the circuit for filtering out interference includes a capacity cell.

Additionally, the preset voltage is a voltage value acquired by the control circuit from the amplification circuit when the control circuit does not transmit the first voltage signal to the signal trigger circuit. In this implementation, since the preset voltage is the voltage value acquired by the control circuit when the signal trigger circuit is turned off, which is fixed, thus the state of the detection area can be accurately determined by comparing different detection signals with the preset voltage when there is, or is no ground within the detection area.

DESCRIPTION OF THE DRAWINGS

One or more embodiments are exemplarily illustrated by corresponding figures in the accompanying drawings, and the elements with the same reference number label in the attached drawings are represented as similar elements unless otherwise stated. Moreover, the figures in the drawings do not constitute a scale limitation.

DETAILED DESCRIPTION

In order to make the purpose, technical solutions and advantages of the embodiment of the present application clearer, the embodiments of the present application will be described in detail below with reference to the accompanying drawings. However, it will be understood by those of ordinary skill in the art that, in the various embodiments of the present application, many technical details are set forth in order to provide readers with a better understanding of the present application. Whereas, the technical solutions claimed in the present application may also be implemented without these technical details and various changes and modifications based on the following embodiments.

Figure 1:
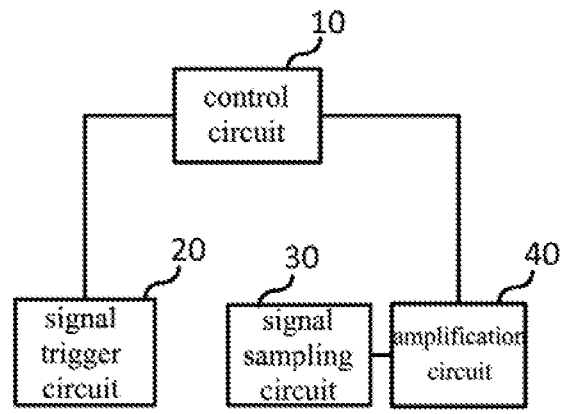
FIG. 1 is a structural schematic diagram of the ground detection device in a first embodiment of the present application.

A first embodiment of the present application relates to a ground detection device, the specific structure of which is as shown in FIG. 1. The ground detection device includes: a control circuit 10, a signal trigger circuit 20, a signal sampling circuit 30 and an amplification circuit 40.

Where, a first end of the control circuit 10 is connected to the signal trigger circuit, a second end of the control circuit 10 is connected to an output end of the amplification circuit, and the signal sampling circuit is connected to an input end of the amplification circuit.

Specifically, the control circuit 10 is configured to transmit a first voltage signal to the signal trigger circuit 20; the signal trigger circuit 20 is configured to acquire the first voltage signal and generate an optical signal according to the first voltage signal; the signal sampling circuit 30 is configured to acquire reflected light of the optical signal reflected by a detection area, and ambient interference light, and generate a second voltage signal according to the reflected light and the ambient interference light; the amplification circuit 40 is configured to amplify the second voltage signal to acquire a third voltage signal; and the control circuit 10 is configured to compare the third voltage signal with a preset voltage, and determine whether there is a ground within the detection area according to a comparison result.

It should be noted that, the preset voltage of the present embodiment is a voltage value acquired by the control circuit 10 from the amplification circuit 40 when the control circuit 10 does not transmit the first voltage signal to the signal trigger circuit 20. Since a power source is provided inside the amplification circuit 40, and since the ground does not provide the reflected light, in practical applications, the preset value can be accurately acquired by placing the detection device in an environment without a light source under the influence of no ambient light.

In a specific implementation, when there is a ground within the detection area, the optical signal generated by the signal trigger circuit 20 is irradiated to the ground, and the reflected light of the optical signal reflected by the ground is transmitted to the signal sampling circuit 30. In a case of relatively low ground emissivity, the amount of the reflected light transmitted to the signal sampling circuit 30 is relatively small, and the signal sampling circuit 30 will generate a detection voltage for the reflected light. Since the amplitude of the detection voltage is relatively low due to the relatively low ground reflectivity, the detection voltage may be amplified through the amplification circuit 40, and the control circuit 10 will determine that there is a difference value between the amplified detection voltage and the preset voltage; when there is no ground within the detection area, the optical signal generated by the signal trigger circuit 20 is irradiated to the detection area, and the reflected light of the optical signal will not be transmitted to the signal sampling circuit 30 due to no ground, so the case where there is no ground is the same as the case where the control circuit 10 does not transmit the first voltage signal to the signal trigger circuit 20, at this time, the detection voltage acquired by the control circuit 10 is substantially the same as the preset voltage. Therefore, after the control circuit 10 transmits the first voltage signal to the signal trigger circuit 20, the detection voltage transmitted from the amplification circuit 40 is compared with the preset voltage. If the detection voltage is different from the preset voltage, the detection area is determined to be ground; if the detection voltage is substantially the same as the preset voltage, it is determined that there is no ground within the detection area.

Figure 2A:
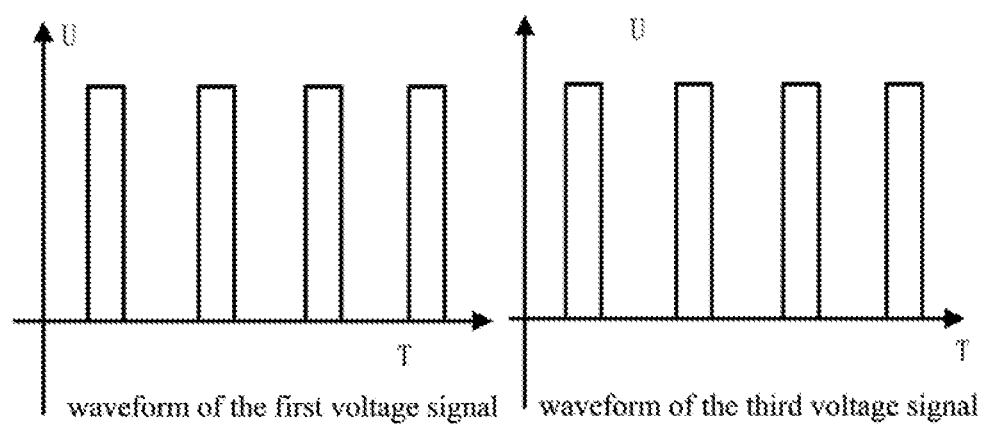
FIG. 2A is a comparison chart of waveforms in another specific implementation of the first embodiment of the present application when there is a ground within a detection area.
Figure 2B:
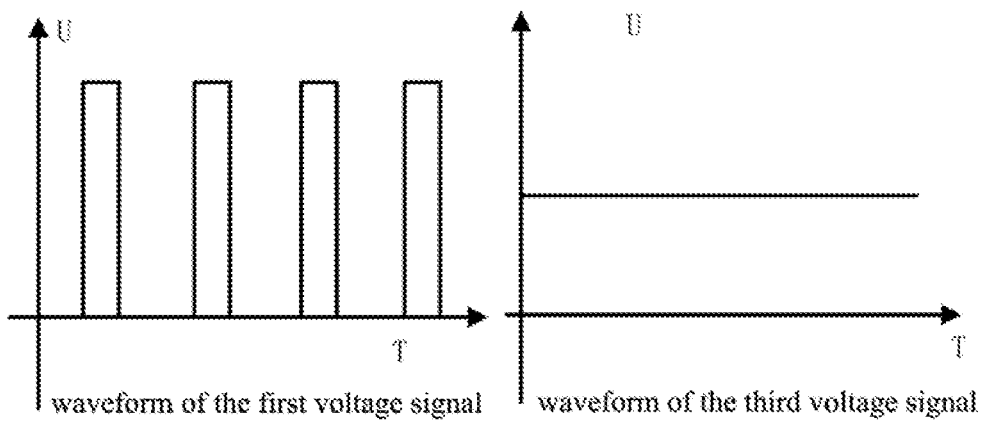
FIG. 2B is a comparison chart of waveforms in another specific implementation of the first embodiment of the present application when there is no ground within a detection area.

In another specific implementation, in the present embodiment, since the first voltage signal sent by the control circuit 10 to the signal trigger circuit 20 is an AC voltage signal, in practical applications, the control circuit 10 may further determine whether there is a ground within the detection area through determining whether the waveforms of the first voltage signal and the third voltage signal acquired by the amplification circuit 40 are the same. As shown in FIG. 2A, when the first voltage signal is a square wave, and when the waveform of the first voltage signal is the same as the waveform of the third voltage signal, it is indicated that there is a ground within the detection area. As shown in FIG. 2B, when the waveform of the first voltage signal is different from the waveform of the third voltage signal, it is indicated that there is no ground within the detection area. Certainly, the present embodiment is only illustrated by taking an example in which the first voltage signal is a square wave, but the first voltage signal may also be in other waveforms such as a sawtooth wave, sine wave etc., which are within the scope of the present application as long as it can be determined whether there is a ground within the detection area based on the waveforms of the first voltage signal and the third voltage signal.

Compared with the prior art, the ground detection device provided by the embodiment of the present application, the control circuit controls the signal trigger circuit to generate the optical signal, and the signal sampling circuit acquires the reflected light of the optical signal reflected by the detection area and the ambient interference light, and generates the detection signal for the detection area. When the reflectivity of the ground is relatively low, the detection signal sufficient to determine the detection area may be acquired through the amplification effect of the amplification circuit, and the real ground conditions within the detection area may be acquired through comparing the detection signal with the preset voltage.

Figure 3:
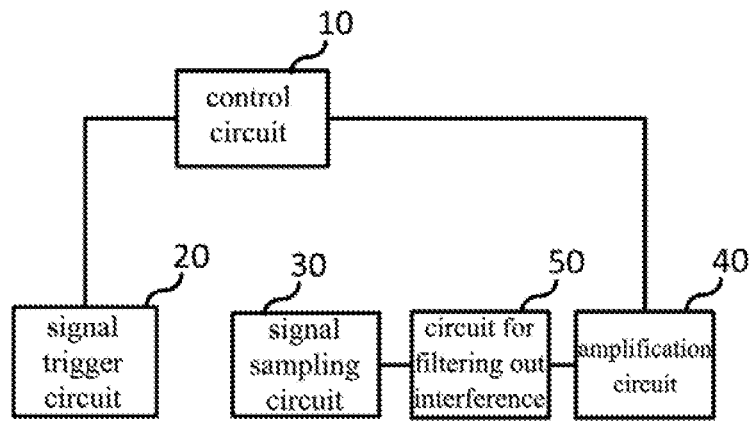
FIG. 3 is a structural schematic diagram of the ground detection device in a second embodiment of the present application.

A second embodiment of the present application relates to a ground detection device. The second embodiment is substantially the same as the first embodiment, and the main difference is that a circuit 50 for filtering out interference is added to the first embodiment, the specific structure of which is as shown in FIG. 3.

Where, a first end of the circuit 50 for filtering out interference is connected to the sampling circuit 30, and a second end of the circuit 50 for filtering out interference is connected to the input end of the amplification circuit 40. Where, the circuit 50 for filtering out interference is configured to filter out a DC voltage signal generated in the second voltage signal due to the ambient interference light.

It should be noted that, in the present embodiment, since the ambient interference light is generally strong light, and the strong light generally generates a DC signal, and the circuit 50 for filtering out interference may employ a capacity cell, thus the circuit 50 for filtering out interference may filter out the interference signal generated by the ambient interference light, i.e., the strong light, by utilizing the DC isolation characteristic of the capacity cell, such that only the voltage signal generated by the reflected light is amplified, and the detection voltage acquired by the control circuit from the amplification circuit is more accurate.

Compared with the prior art, in the ground detection device provided by the embodiment of the present application, the control circuit controls the signal trigger circuit to generate the optical signal, and the signal sampling circuit acquires the reflected light of the optical signal reflected by the detection area and the ambient interference light, and generates the detection signal for the detection area. When the reflectivity of the ground is relatively low, the detection signal sufficient to determine the detection area may be acquired through the amplification effect of the amplification circuit, and the real ground conditions within the detection area may be acquired through comparing the detection signal with the preset voltage. Through adding the circuit for filtering out interference, the DC signal generated by the ambient interference light can be filtered out to eliminate the influence of the ambient interference light, thereby making the ground detection result for the detection area more accurate.

Figure 4:
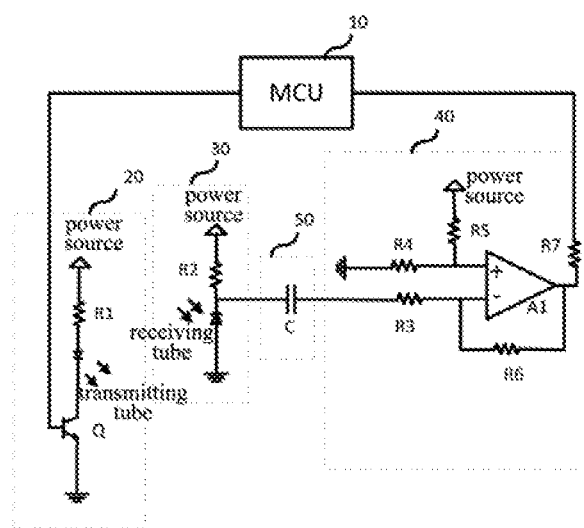
FIG. 4 is a structural schematic diagram of the ground detection device in a third embodiment of the present application.

A third embodiment of the present application relates to a ground detection device. The present embodiment is substantially the same as the second embodiment, and the main difference is that the present embodiment specifically describes the circuit configuration of the control circuit, the signal trigger circuit, the signal sampling circuit, the circuit for filtering out interference and the amplification circuit in the second embodiment. In addition, it should be understood by those skilled in the art that the specific description for the circuits of the ground detection device, in the present embodiment, is merely an exemplary description, and the ground detection device is not limited to the ground detection device having such configuration in practice, the specific configuration of which is as shown in FIG. 4.

Specifically, the control circuit in the embodiment of the present application is specifically selected as a Microcontroller Unit (MCU). The circuit for filtering out interference employs a capacity cell. Moreover, the signal trigger circuit 20 includes a strobe element Q, a transmitting tube and a first resistor R1; the first end of the control circuit 10 is connected to an input end of the strobe element Q, an first output end of the strobe element Q is connected to a first end of the transmitting tube, and a second output end of the strobe element Q is grounded; a second end of the transmitting tube is connected to a first end of the first resistor R1, and a second end of the first resistor R1 is connected to a power source; where, if it is determined that the voltage acquired by the signal trigger circuit is not less than the first voltage signal, then the control circuit 10 controls the strobe element Q to be in an on state. The strobe element Q in the present embodiment uses a triode.

Where, the signal sampling circuit 30 includes: a receiving tube and a second resistor R2; a first end of the receiving tube is connected to a first end of the second resistor R2 and a first end of the circuit 50 for filtering out interference, a second end of the receiving tube is grounded, and a second end of the second resistor R2 is connected to a power source.

Where, the amplification circuit 40 includes: a third resistor R3, a fourth resistor R4, a fifth resistor R5, a sixth resistor R6, a seventh resistor R7 and an amplifier A1; a first end of the third resistor R3 is connected to a second end of the circuit 50 for filtering out interference, a second end of the third resistor R3 is connected to a negative input end of the amplifier A1; a first end of the fourth resistor R4 is grounded, and a second end of the fourth resistor R4 is connected to a positive input end of the amplifier A1; a first end of the fifth resistor R5 is connected to the second end of the fourth resistor R4, and a second end of the fifth resistor R5 is connected to a power source; the sixth resistor R6 is connected in parallel between the negative input end of the amplifier A1 and an output end of the amplifier A1; a first end of the seventh resistor R7 is connected to the output end of the amplifier A1, and a second end of the seventh resistor R7 is the output end of the amplification circuit 40.

It should be noted that, in the present embodiment, the amplification circuit 40 uses a differential amplifier to amplify the voltage signal transmitted over by the circuit for filtering out interference. Moreover, the resistance values of the resistors R4 and R5 are equal, the resistance values of the resistors R3 and R6 may be adjustable, and the magnification of the amplifier is adjusted by adjusting the proportional relationship between R3 and R6.

It is worth mentioning that, the circuit units mentioned in the first embodiment, the second embodiment or the third embodiment of the present application, in practice, may be implemented through a digital circuit unit or a logic circuit unit, or through a part of a physical unit, or through a combination of a plurality of physical units. In addition, in order to highlight the innovative part of the present application, a unit that is not closely related to solving the technical problem proposed by the present application is not introduced in the present embodiment, which does not mean that there are no other units in the present embodiment.

A fourth embodiment of the present application relates to a robot including the above-described ground detection device in the first, second or third embodiment.

Figure 5:
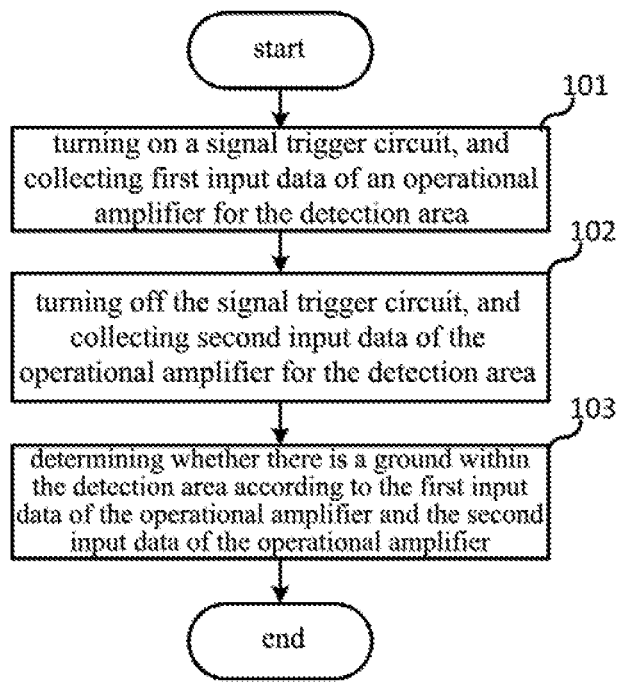
FIG. 5 is a structural schematic diagram of the ground detection method in a fifth embodiment of the present application.

A fifth embodiment of the present application relates to a ground detection method applied to the robot in the fourth embodiment. The specific process is as shown in FIG. 5 and includes the following steps.

At the step 101, turning on a signal trigger circuit, and collecting first input data of an operational amplifier for the detection area.

Specifically, in the present embodiment, when the robot travels forward along a preset track, an optical signal is emitted to the detection area in front of the travelling direction of the robot through turning on a signal trigger circuit, and a reflected light of the optical signal reflected by the detection area is received, and the first input data of the operational amplifier generated according to the reflected light is collected.

It should be noted that, in the present embodiment, the time for the robot to turn on the signal trigger circuit may be set in advance according to a user's needs. For example, the signal trigger circuit is set to be turned on once every one second. The specific time interval to turn on the signal trigger circuit is not limited in the present embodiment.

At the step 102: turning off the signal trigger circuit, and collecting second input data of the operational amplifier for the detection area.

Specifically, in the present embodiment, the signal trigger circuit is turned off at preset time intervals. In a case where no optical signal is irradiated to the detection area, and where no light reflected by the ground is received, the collected second input data of the operational amplifier for the detection area is actually a preset voltage signal acquired by the robot according to the internal circuit configuration.

It should be noted that, in the present embodiment, the time interval for the robot to turn off the signal trigger circuit is the same as the time interval for the robot to turn on the signal trigger circuit.

At the step 103: determining whether there is a ground within the detection area according to the first input data of the operational amplifier and the second input data of the operational amplifier.

Specifically, the first input data of the operational amplifier is compared with the second input data of the operational amplifier, and it is determined that there is no ground within the detection area if the first input data of the operational amplifier is equal to the second input data of the operational amplifier, and it is determined that there is a ground within the detection area if the first input data of the operational amplifier is not equal to the second input data of the operational amplifier.

Compared with the prior art, in the ground detection method provided by the present embodiment, the ground conditions for the detection area may be acquired through the first input data of the operational amplifier acquired by turning on the signal trigger circuit and the second input data of the operational amplifier acquired by turning off the signal trigger circuit, thereby making the ground detection more convenient.

Figure 6:
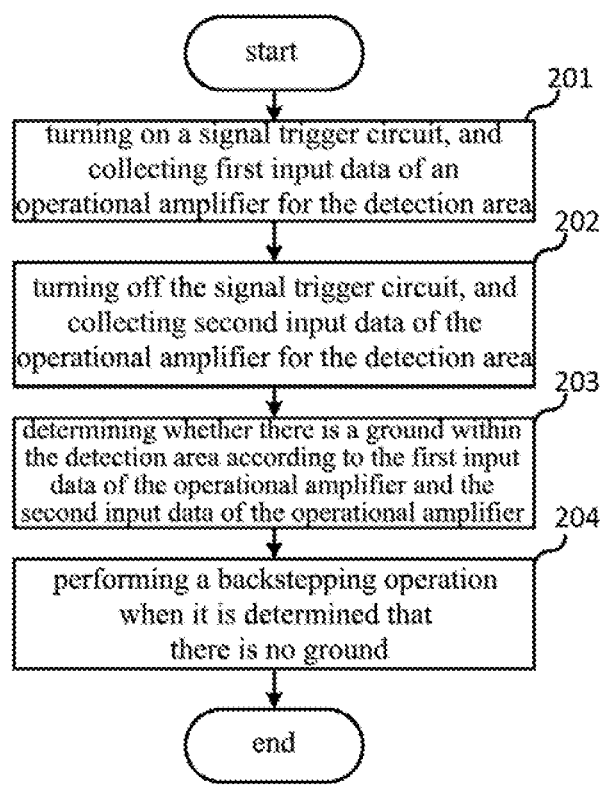
FIG. 6 is a structural schematic diagram of the ground detection device in a sixth embodiment of the present application.

A sixth embodiment of the present application relates to a ground detection method. The present embodiment is further improved on the basis of the fifth embodiment, the specific improvement of which is that: after the step of determining whether there is a ground within the detection area, performing a backstepping operation is added in the case where it is determined that there is no ground. The flow of the ground detection method in the present embodiment is as shown in FIG. 6. Specifically, in the present embodiment, steps from 201 to 204 are included, where, the steps from 201 to 203 are substantially the same as the steps from 101 to 103 in the fifth embodiment, the details of which are not described herein again. The following is mainly described for differences, and the technical details that are not described thoroughly in the present embodiment may refer to the ground detection method provided in the fifth embodiment, details of which are not described herein again.

After the step 201 to step 203, a step 204 is performed.

At the step 204, performing a backstepping operation when it is determined that there is no ground.

Specifically, in the case where it is determined that there is no ground in front of the travelling direction of the robot, which indicates that there is a road condition, such as a cliff or a gully etc. that is unfavorable for traveling, in front of the travelling direction, the damage caused by falling down forward can be avoided through performing the backstepping operation.

Compared with the prior art, in the ground detection method provided by the present embodiment, the ground conditions for the detection area may be acquired through the first input data of the operational amplifier acquired by turning on the signal trigger circuit and the second input data of the operational amplifier acquired by turning off the signal trigger circuit, thereby making the ground detection more convenient. Moreover, in the case where it is determined that there is no ground, the damage caused by falling down can be avoided through performing the backstepping operation.

The steps of the above various methods are divided for the purpose of clear description, and may be combined into one step, or certain steps may be split into or decomposed into a plurality of steps during implementation, which are all within the protection scope of the present patent as long as the same logical relationship is included. The algorithm or process added with an insignificant modification, or brought in an insignificant design without changing the core design of its algorithm or process, is covered by the protection scope of the present patent.

Those of ordinary skill in the art should understand that, the above embodiments are specific embodiments for implementing the present application, and various modifications may be made in the form and details without departing from the spirit and scope of the present application.

What is claimed is:

1. A ground detection device, comprising a control circuit, a signal trigger circuit, a signal sampling circuit and an amplification circuit,
    wherein a first end of the control circuit is connected to the signal trigger circuit, a second end of the control circuit is connected to an output end of the amplification circuit, and the signal sampling circuit is connected to an input end of the amplification circuit;
    wherein,
    the control circuit is configured to transmit a first voltage signal to the signal trigger circuit;

the signal trigger circuit is configured to acquire the first voltage signal, and to generate an optical signal according to the first voltage signal;

the signal sampling circuit is configured to acquire reflected light of the optical signal reflected by a detection area, and ambient interference light, and to generate a second voltage signal according to the reflected light and the ambient interference light;

the amplification circuit is configured to amplify the second voltage signal to acquire a third voltage signal; and the control circuit is configured to compare the third voltage signal with a preset voltage, and to determine whether there is a ground within the detection area according to a comparison result;

wherein the signal trigger circuit comprises a strobe element, a transmitting tube and a first resistor;

wherein the first end of the control circuit is connected to an input end of the strobe element, a first output end of the strobe element is connected to a first end of the transmitting tube, and a second output end of the strobe element is grounded;

wherein a second end of the transmitting tube is connected to a first end of the first resistor, and a second end of the first resistor is connected to a power source;

wherein the control circuit controls the strobe element to be in an on state if it is determined that the voltage acquired by the signal trigger circuit is not less than the first voltage signal.

2. The ground detection device according to claim 1, wherein, the ground detection device further comprises a circuit for filtering out interference;

wherein a first end of the circuit for filtering out interference is connected to the sampling circuit, and a second end of the circuit for filtering out interference is connected to the input end of the amplification circuit;

wherein the circuit for filtering out interference is configured to filter out a DC voltage signal generated in the second voltage signal due to the ambient interference light.

3. The ground detection device according to claim 2, wherein, the signal sampling circuit comprises a receiving tube and a second resistor;

wherein a first end of the receiving tube is connected to a first end of the second resistor and the first end of the circuit for filtering out interference, a second end of the receiving tube is grounded, and a second end of the second resistor is connected to a power source.

4. The ground detection device according to claim 3, wherein, the amplification circuit comprises a third resistor, a fourth resistor, a fifth resistor, a sixth resistor, a seventh resistor and an amplifier;

wherein, a first end of the third resistor is connected to the second end of the circuit for filtering out interference, and a second end of the third resistor is connected to a negative input end of the amplifier;

a first end of the fourth resistor is grounded, and a second end of the fourth resistor is connected to a positive input end of the amplifier;

a first end of the fifth resistor is connected to the second end of the fourth resistor, and a second end of the fifth resistor is connected to a power source;

the sixth resistor is connected in parallel between the negative input end of the amplifier and an output end of the amplifier; and a first end of the seventh resistor is connected to the output end of the amplifier, and a second end of the seventh resistor is the output end of the amplification circuit.

5. The ground detection device according to claim 2, wherein, the circuit for filtering out interference comprises a capacity cell.

6. The ground detection device according to claim 1, wherein, the preset voltage is a voltage value acquired by the control circuit from the amplification circuit when the control circuit does not transmit the first voltage signal to the signal trigger circuit.

7. A robot comprising a ground detection device, wherein, the ground detection device comprises a control circuit, a signal trigger circuit, a signal sampling circuit and an amplification circuit, wherein a first end of the control circuit is connected to the signal trigger circuit, a second end of the control circuit is connected to an output end of the amplification circuit, and the signal sampling circuit is connected to an input end of the amplification circuit;

wherein, the control circuit is configured to transmit a first voltage signal to the signal trigger circuit;

the signal trigger circuit is configured to acquire the first voltage signal, and to generate an optical signal according to the first voltage signal;

the signal sampling circuit is configured to acquire reflected light of the optical signal reflected by a detection area, and ambient interference light, and to generate a second voltage signal according to the reflected light and the ambient interference light;

the amplification circuit is configured to amplify the second voltage signal to acquire a third voltage signal; and the control circuit is configured to compare the third voltage signal with a preset voltage, and to determine whether there is a ground within the detection area according to a comparison result;

wherein the signal trigger circuit comprises a strobe element, a transmitting tube and a first resistor;

wherein the first end of the control circuit is connected to an input end of the strobe element, a first output end of the strobe element is connected to a first end of the transmitting tube, and a second output end of the strobe element is grounded;

wherein a second end of the transmitting tube is connected to a first end of the first resistor, and a second end of the first resistor is connected to a power source;

wherein the control circuit controls the strobe element to be in an on state if it is determined that the voltage acquired by the signal trigger circuit is not less than the first voltage signal.

8. The robot according to claim 7, wherein, the ground detection device further comprises a circuit for filtering out interference;

wherein a first end of the circuit for filtering out interference is connected to the sampling circuit, and a second end of the circuit for filtering out interference is connected to the input end of the amplification circuit;

wherein the circuit for filtering out interference is configured to filter out a DC voltage signal generated in the second voltage signal due to the ambient interference light.

9. The robot according to claim 8, wherein, the signal sampling circuit comprises a receiving tube and a second resistor;

wherein a first end of the receiving tube is connected to a first end of the second resistor and the first end of the circuit for filtering out interference, a second end of the receiving tube is grounded, and a second end of the second resistor is connected to a power source.

10. The ground detection device according to claim 9, wherein, the amplification circuit comprises a third resistor, a fourth resistor, a fifth resistor, a sixth resistor, a seventh resistor and an amplifier;

wherein, a first end of the third resistor is connected to the second end of the circuit for filtering out interference, and a second end of the third resistor is connected to a negative input end of the amplifier;

a first end of the fourth resistor is grounded, and a second end of the fourth resistor is connected to a positive input end of the amplifier;

a first end of the fifth resistor is connected to the second end of the fourth resistor, and a second end of the fifth resistor is connected to a power source;

the sixth resistor is connected in parallel between the negative input end of the amplifier and an output end of the amplifier; and a first end of the seventh resistor is connected to the output end of the amplifier, and a second end of the seventh resistor is the output end of the amplification circuit.

11. The ground detection device according to claim 8, wherein, the circuit for filtering out interference comprises a capacity cell.

12. The ground detection device according to claim 7, wherein, the preset voltage is a voltage value acquired by the control circuit from the amplification circuit when the control circuit does not transmit the first voltage signal to the signal trigger circuit.

* * * * *